United States Patent [19]

Higashiyama et al.

[11] Patent Number: 5,019,475
[45] Date of Patent: May 28, 1991

[54] IMAGE RECORDING MEDIUM COMPRISING A COLOR DEVELOPER LAYER FORMED ON A THERMOPLASTIC RESIN LAYER

[75] Inventors: Shunichi Higashiyama, Yokkaichi; Keiko Suzuki, Okazaki, both of Japan

[73] Assignee: Brother Kogyo Kabushiki Kaisha, Nagoya, Japan

[21] Appl. No.: 497,360

[22] Filed: Mar. 22, 1990

[30] Foreign Application Priority Data

Apr. 28, 1989 [JP] Japan .................................. 1-109760
Aug. 18, 1989 [JP] Japan .................................. 1-213281

[51] Int. Cl.$^5$ .................. G03C 1/72; G03C 5/24; F41M 5/26
[52] U.S. Cl. .................................. 430/138; 430/202; 430/203; 430/235; 430/253; 430/254; 428/402.21; 503/214; 503/215; 503/226
[58] Field of Search ............... 430/138, 202, 203, 199, 430/253, 254, 235; 428/402.21; 503/214, 215, 226

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/138 |
| 4,554,235 | 11/1985 | Adair et al. | 430/138 |
| 4,622,282 | 11/1986 | Head et al. | 430/138 |
| 4,701,397 | 10/1987 | Rourke et al. | 430/138 |
| 4,772,529 | 9/1988 | Sakai | 430/138 |
| 4,865,938 | 9/1989 | Sakai et al. | 430/138 |
| 4,948,695 | 8/1990 | Matsushita et al. | 430/138 |

FOREIGN PATENT DOCUMENTS 64-36482  2/1989  Japan .
2202641   9/1988  United Kingdom .

OTHER PUBLICATIONS

Abstract of J61 162390, "Heat-Sensitive Transfer...", 7/86, Konishiroku.
Abstract of J61 162391, "Heat-Sensitive Transfer...", 7/86, Konishiroku.
Abstract of J61 141589, "Heat-Sensitive Recording...," 6/86, Fuji.

Primary Examiner—Hoa Van Le
Assistant Examiner—Patrick A. Doody
Attorney, Agent, or Firm—Oliff & Berridge

[57] ABSTRACT

A recording medium enabling formation of an image on any desired material is disclosed. The recording medium comprises a base sheet, a thermoplastic resin layer formed on at least one side of the base sheet, and a color developer layer formed on the thermoplastic resin layer and capable of color development by reaction with a dye precursor.

17 Claims, 3 Drawing Sheets

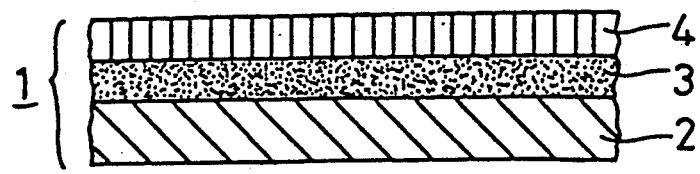
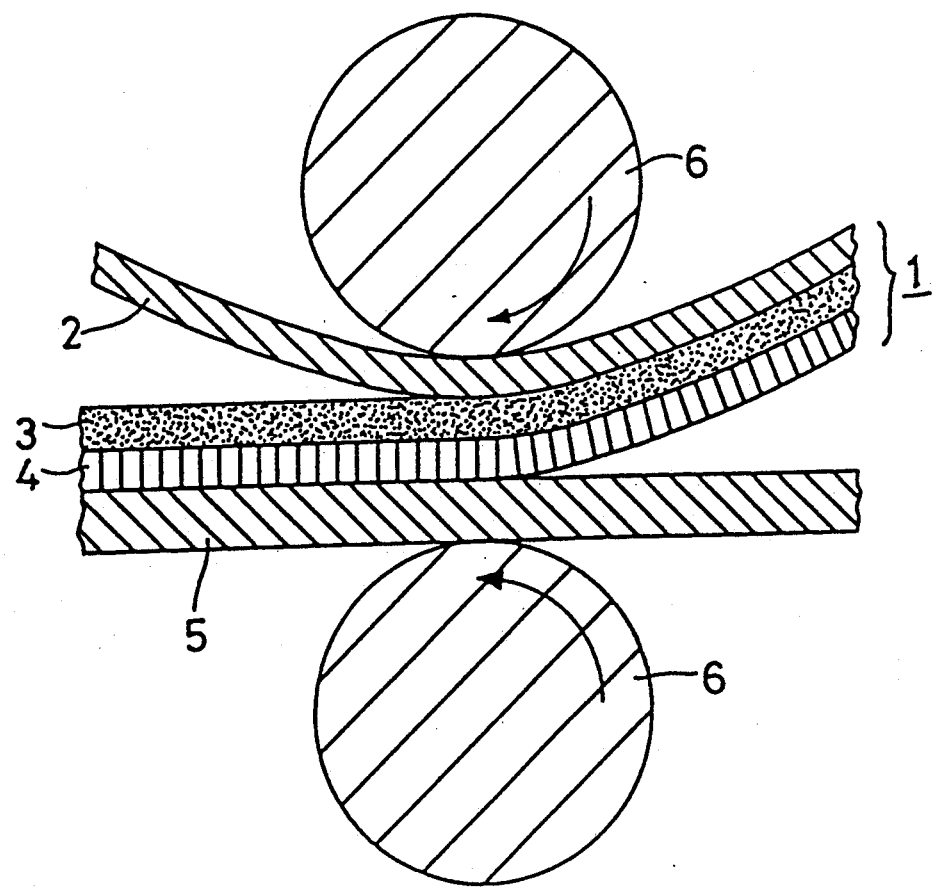

IMAGE RECORDING MEDIUM COMPRISING A COLOR DEVELOPER LAYER FORMED ON A THERMOPLASTIC RESIN LAYER

BACKGROUND OF THE INVENTION

1. Field of the Invention

The present invention relates to an image recording medium having a layer of color developer capable of color development by the reaction with a dye precursor encapsulated in microcapsules upon press development.

2. Description of Related Art

Photosensitive pressure-sensitive recording media have been known, such as: a self-contained type recording medium comprising a support having on the surface thereof microcapsules encapsulating a photocurable resin, a photopolymerization initiator and a dye precursor as main components, and a substance capable of color development (a so-called "color developer") by reacting with the dye precursor; and a separate-sheet type recording medium composed of a photosensitive sheet coated with photocurable microcapsules as described above and another separate sheet coated with a color developer (color developer sheet), as described, for example, in Japanese Patent Application (OPI) Nos. 23025/83, 88739/83 and 88740/83. (The term "OPI" means unexamined, published application).

These recording media utilize the property of microcapsules that become cured upon light-exposure due to the photocurable resin, etc. encapsulated therein. Such a recording medium is mounted on a device which effects the steps involving exposing the microcapsules to light in conformity with image information and rupturing unexposed and uncured microcapsules to bring the dye precursor encapsulated therein in contact with the color developer which is provided on the same surface of the recording medium or coated on another sheet, whereby a color-forming reaction occurs between the dye precursor and the color developer to form an image.

However, in the above-described systems, recording can only be effected on the specifically processed sheets, i.e., the photosensitive pressure-sensitive sheet or the color developer sheet but not on ordinary paper or other substrates such as cloth, PET film, etc.

A recording medium for solving the above problems is disclosed in Japanese Patent Application (OPI) No. 36482/89 which corresponds to U.S. patent application No. 07/184,096. This recording medium has a color developer medium which includes a base sheet made of polyethylene terephthalate, a color developer layer formed on the base sheet, and a thermoplastic resin layer formed on the color developer layer.

The manner of forming an image on ordinary paper is described with reference to the color developer medium. Initially, the ordinary paper and the thermoplastic resin layer of the color developer medium are superposed and heated, thereby causing the ordinary paper and the color developer to be bonded together. Subsequently, the base sheet of the color developer medium is removed thus forming a color developer layer on the surface of the ordinary paper. A photosensitive sheet which has been exposed to light in conformity with an image of an original and the color developer layer on the ordinary paper are then superposed and pressed by means of a press-developing device. By such pressing, uncured microcapsules on the photosensitive sheet are ruptured whereupon a dye precursor and the color developer react with each other, thereby forming an image conforming to the image of the original on the ordinary paper.

However, there are some materials on which no image can be formed when using the above color developer medium. More particularly, the above-described developer medium requires a pressing force exerted from the press-developing device as high as about 600 kg/cm$^2$. The application of such a high pressure will break or deform certain kinds of materials such as glass, hard plastics and the like. Thus, no image can be formed on these types of materials with the above-described process. It is not possible to form clear images on some materials such as cloth which are not flat and are stretchable because a pressing force from the press-developing device cannot be uniformly applied.

SUMMARY OF THE INVENTION

An object of the present invention is to provide a recording medium which is able to form an image even on materials which will be broken or deformed when applied with a high pressure.

Another object of the present invention is to provide a recording medium which is able to form an image on surfaces which are not flat and thus unable to have a uniform pressing force applied thereto.

The above objects can be achieved, according to the present invention, by a recording medium which comprises: a base sheet, a thermoplastic resin layer formed on at least one side of the base sheet and a color developer layer formed on the thermoplastic resin layer and capable of color development by reaction with a dye precursor.

Another object of the present invention is to provide a method for forming an image wherein an image can be formed even on materials which will be broken or deformed when a high pressure is applied thereto or which are not flat and therefore cannot have a uniform pressing force applied thereto.

This object can be attained, according to the present invention, by a method for forming an image on a material which comprises: forming an image on a recording medium having a base sheet, a thermoplastic resin layer formed on the base sheet and a color developer layer formed on the thermoplastic resin layer by reacting a color developer of the color developer layer with a dye precursor; superposing the color developer layer of the recording medium on which the image has been formed, and a material on which the image is to be formed; heating the superposed recording medium and material on which the image is to be formed to bond the color developer layer of the recording medium and the material on which the image is to be formed; and separating the base sheet of the recording medium from the material.

BRIEF DESCRIPTION OF THE DRAWINGS

A preferred embodiment of the present invention will be described in detail with reference to the following figures wherein:

FIG. 1 is a sectional view of a color developer medium;

FIG. 2 is an illustrative view of a method for forming a color developer image on a sheet on which an image is formed;

DETAILED DESCRIPTION OF THE PREFERRED EMBODIMENTS

FIG. 1 is a sectional view of a color developer medium according to one embodiment of the invention. A color developer medium 1 has a base sheet 2 made of a polyethylene terephthalate film, a thermoplastic resin layer 3 formed on the base sheet and a color developer layer 4 formed on the thermoplastic resin layer 3.

Figure 3:
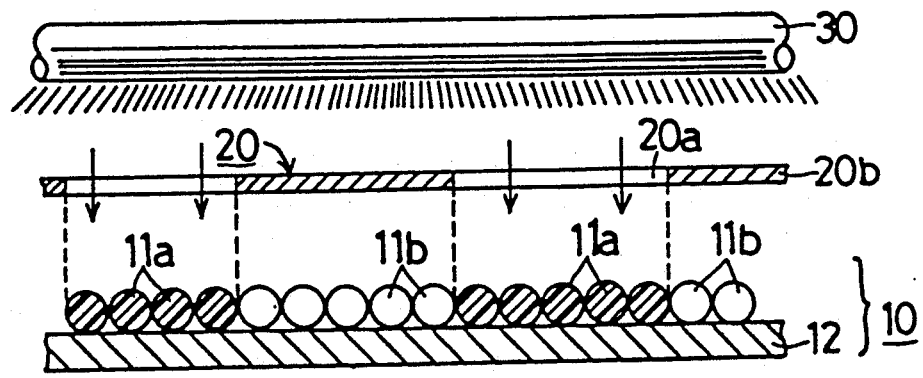
FIG. 3 is an illustrative view of a method for forming a latent image on a photosensitive, pressure-sensitive medium.
Figure 4:
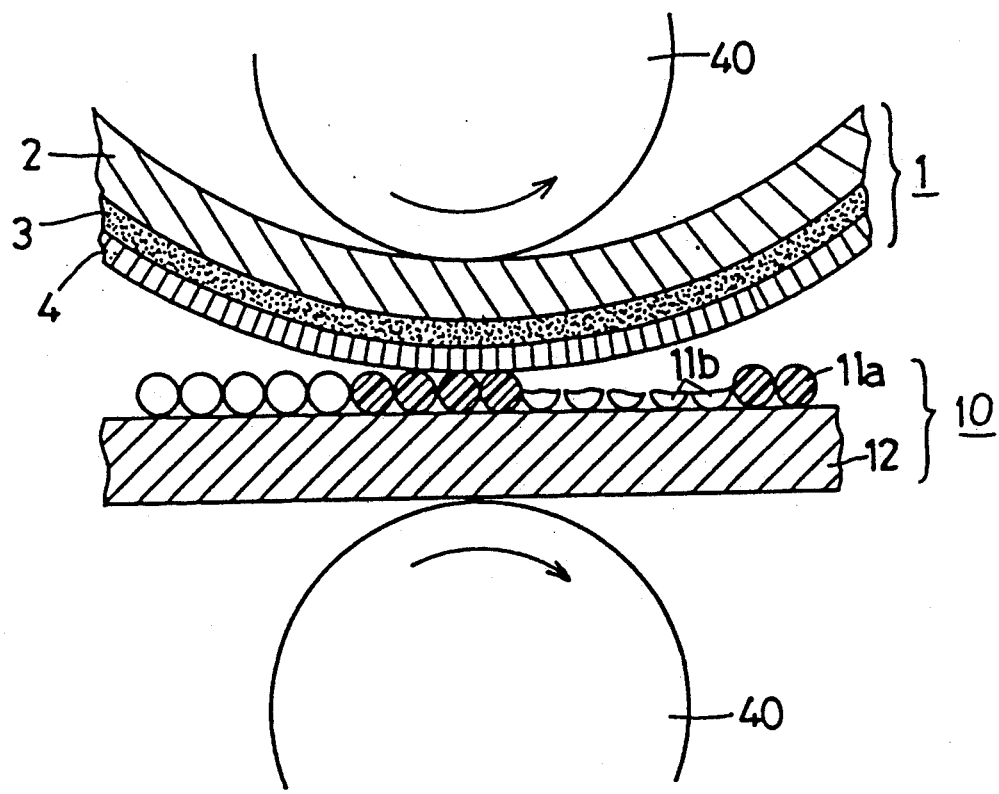
FIG. 4 is an illustrative view of a method for forming a visible image on a color developer medium.

Reference is now made to FIGS. 2 to 4 wherein formation of a color developer image on a sheet 5 to be formed with an image, e.g. ordinary paper, plastic film, cloth or the like is illustrated.

FIG. 3 is an illustrative view of a method for forming a latent image on a photosensitive, pressure-sensitive medium. A back side of an original 20 and a layer of microcapsules 11a, 11b of a photosensitive, pressure-sensitive medium 10 are superposed. Subsequently, light from a light source 30 is irradiated on the original 20, so that microcapsules 11a of the photosensitive, pressure-sensitive medium 10 corresponding to the transmitted portion 20a of the original 20 are exposed to light. For this purpose, light reflected from the original or a modulated laser beam scanned with a polygon mirror may be utilized. By the exposure, the microcapsules 11a exposed to light are cured, whereby a latent image corresponding to an image of the original 20 is formed on the photosensitive, pressure-sensitive medium 10. Thereafter, as shown in FIG. 4, the color developer layer 4 of the color developer medium 1 is superposed on the layer of the microcapsules 11a, 11b of the photosensitive, pressure-sensitive medium 10 and pressed by a pair of press rollers 40. This leads to rupture of uncured microcapsules 11b whereupon a dye precursor contained therein comes into contact with a color developer of the color developer layer 4 to develop a color at the contacted portion based on reaction between the microcapsules and developer, thereby forming a reverse image of the original 20.

Reference is now made to FIG. 2 so as to illustrate a method for forming a color developer image on the sheet to be formed with an image such as, for example, ordinary paper, cloth, plastic film or the like. The color developer layer 4 of the color developer medium 1 on which the color developer image has been formed according to the method shown in FIG. 4 and the sheet 5 such as, for example, ordinary paper, cloth or plastic film are superposed and heat or hot pressed by means of a pair of heating rollers 6. By this process, the color developer 4 and a binder in the color developer layer 4 are made molten, so that the color developer layer 4 is bonded to the sheet to be formed with an image by the action of the binder. When the base sheet 2 of the color developer medium 1 is removed, the color developer layer 4 with the color developer image is transferred to the sheet 5 from the color developer medium 1. Since the thermoplastic resin 3 is also molten, the base sheet 2 can be readily removed. Additionally, since the color developer layer 4 is covered with the thermoplastic resin 3, the color developer is not peeled off sheet 5. Thus, while some of the thermoplastic resin layer may be removed with the base sheet, the developer layer will remain on sheet 5. It will be noted that the heating roller used is operated at 130° C. at a feeding speed of 10 mm/second, but other known heating conditions may be used. It is preferable that the thermoplastic resin layer has a melting point of at least 80° C. This melting point serves to prevent the thermoplastic resin layer from melting during storage and shipping. Any heating means may be used instead of the heating roller, e.g. a heating plate may be used. Thus, the thermoplastic resin layer serves the purposes of securing the base sheet and developer material together when at ambient temperature and of permitting the base sheet to be removed from the developer material at high temperatures without removing the developer material from sheet 5.

The composition and manner of preparation of the photosensitive, pressure-sensitive medium 10 are now described. As shown in FIG. 3, the photosensitive, pressure-sensitive medium 10 includes a base sheet 12 and the layer of microcapsules 11a, 11b formed on the base sheet. The microcapsules 11a, 11b contain therein a photocurable resin, a photopolymerization initiator and a dye precursor. Typical examples of the photocurable resin include ethylene glycol diacrylate, ethylene glycol dimethacrylate, trimethylolpropane triacrylate, or diethylene glycol dimethacrylate. Examples of the photopolymerization initiator include α-alkoxyphenylene ketones, polycyclic quinones, benzophenone, substituted benzophenonexanthones, or thioxanthone. The dye precursors are those having lactone, lactam or spiropyran structures and include, for example, triarylmethane compounds or bisphenylmethane compounds. Specific examples include crystal violet lactone or benzoylleucomethylene blue. The microcapsules 11a, 11b of the photosensitive, pressure-sensitive medium 10 can be prepared by any known technique such as, for example, a coacervation technique or an interfacial polymerization technique. The liquid materials in the microcapsules 11a, 11b are used in amounts of 50 parts by weight of a photocurable resin, 3 parts by weight of a dye precursor, and 2.5–4 parts by weight of a photopolymerization initiator, and if necessary, not larger than 1 part by weight of a binder and a plasticizer, and 10 wt% of a photosensitizer based on the polymerization initiator may be used.

The composition and preparation of the color developer medium are now described. The base sheet 2 of the color developer medium 1 should be one which has a relatively high surface smoothness and an appropriate releasing property. To this end, polyester films, polyethylene films and polypropylene films are suitably used. The thickness of the base sheet 2 is in the range of from 50 to 200 μm, preferably approximately 100 μm. Any number of compounds such as, for example, inorganic acidic materials such as acid clay, activated clay, kaolin and the like, phenolic compounds such as p-phenylphenol, and aromatic carboxylic acid compounds such as salicyclic acid, gallic acid, propyltannic acid and the like can be used for the color developer layer 4. These materials and compounds can be used singly or in combination. The color developer may be mixed with a binder at an arbitrary ratio. The resins used to form the thermoplastic resin layer 3 may be those which are able to be softened or melted by heating and solidified by cooling. Examples of such a resin include vinyl resins such as vinyl alcohol/vinyl acetate copolymers, polyvinyl chloride, vinyl chloride/vinyl acetate copolymers and the like; acrylic resins such as ethyl acrylate resin, butyl acrylate resin, methyl cyanoacrylate resin and the like; styrene resin; polyamide resins or waxes.

EXAMPLE 1

In this example, a 75 μm thick polyethylene terephthalate film was used as the base sheet 2 of the color developer medium 1. The color developer layer 4 used was made of acid clay, bisphenol A and p-phenylphenol. The thermoplastic resin layer 3 used was made of a mixture of a styrene/acryl resin and a polyester.

Figure 5:
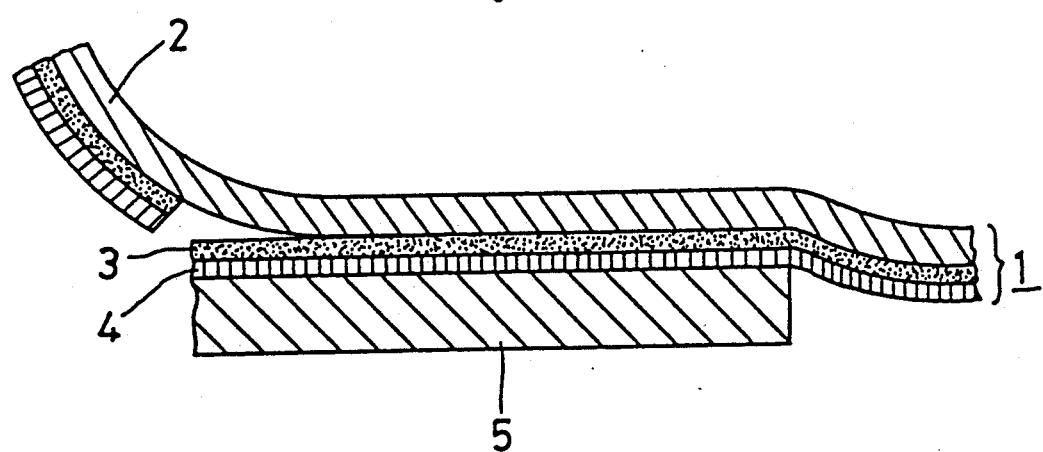
FIG. 5 is an illustrative view of the relationship between the film-forming property and the adhesiveness of thermoplastic resin.

The manner of production of the developer medium 1 is now described. The thermoplastic resin layer 3 is formed on the base sheet 2 as follows: a 50 wt% styrene-/acryl copolymer emulsion (1000 cps.) and a 45 wt% polyester solution (500 cps.) are mixed and the mixture is coated onto a 75 μm thick polyethylene terephthalate film, followed by drying in an oven at 110° C. for 1 minute. The film thickness of the thermoplastic resin layer 3 after the drying is 10 μm. The color developer layer 4 is formed on the thermoplastic resin layer 3 as follows: 50 parts by weight of acid clay, 30 parts by weight of bisphenol A and 30 parts by weight of p-phenylphenol are dispersed in 60 parts by weight of an aqueous solution of polyvinyl alcohol used as a binder to obtain a color developer dispersion. This dispersion is coated onto the dried thermoplastic resin layer 3, followed by drying with hot air in an oven at 80° C. for 1 minute to obtain a color developer layer with a dry thickness of 15 μm. The thermoplastic resin layer 3 and the color developer layer 4 are cut at the edge of the sheet when the base sheet 2 is removed, as shown in FIG. 5.

Prior to the cutting, the following relationships are established:

(1) The adhesion force between the base sheet 2 and the thermoplastic resin layer 3 of the color developer medium 1 is higher than the shearing force of the thermoplastic resin layer 3 and the color developer layer 4.

(2) The adhesion force between the thermoplastic resin layer 3 and the color developer layer 4 of the color developer medium 1 is higher than the shearing force of the thermoplastic resin layer 3 and the color developer layer 4.

After the cutting, the following relationships are established:

(3) The adhesion force between the color developer layer 4 of the color developer medium 1 and the sheet 5 is higher than the adhesion force between the base sheet 2 and the thermoplastic resin layer 3 of the color developer medium 1.

(4) The adhesion force between the thermoplastic resin layer 3 and the color developer layer 4 of the color developer medium 1 is higher than the adhesion force between the base sheet 2 and the thermoplastic resin layer 3 of the color developer medium 1.

The above-described embodiment utilizes a thermoplastic resin layer which performs the functions of securing the base sheet 2 to the color developer layer 4 at ambient temperatures and releasing the base sheet 2 from the color developer layer 4 when heated. This embodiment also uses a binder in the color developer layer 4 which melts when the thermoplastic resin layer is heated. This binder aids in bonding the color developer layer 4 to the sheet upon which the final image is to be formed. However, it is also possible to bond the color developer layer 4 to the sheet upon which the final image is to be formed without melting a binder material. In this case, the color developer layer 4 is bonded to the sheet upon which the final image is to be formed by pressing only. In this case, a material other than the thermoplastic resin layer can be used to perform the functions of securing the color developer layer 4 to base sheet 2 prior to formation of an image on the color developer layer and releasing the base sheet 2 from the color developer layer 4 after the color developer layer is bonded to the sheet upon which the final image is to be formed. In this case, the base sheet would be separated from the color developer layer without heating.

What is claimed is:

1. A recording medium comprising:
   a base sheet;
   a thermoplastic resin layer formed on at least one side of said base sheet; and
   a color developer layer formed on said thermoplastic resin layer and capable of color development by reaction with a dye precursor, wherein said base sheet is separable from said thermoplastic resin layer when said recording medium is heated to a predetermined temperature.

2. The recording medium according to claim 1, wherein said base sheet is selected from the group consisting of polyester films, polyethylene films, and polypropylene films.

3. The recording medium according to claim 1, wherein said thermoplastic resin layer is selected from the group consisting of vinyl resins, acrylic resins, styrene resins, polyamide resins, and waxes.

4. The recording medium according to claim 1, wherein an adhesion force between said thermoplastic resin layer and said color developer layer is higher than an adhesion force between said base sheet and said thermoplastic resin layer when said recording medium is heated to the predetermined temperature.

5. The recording medium according to claim 1, wherein the predetermined temperature is at least 80° C.

6. The recording medium according to claim 1, wherein an adhesion force between said base sheet and said thermoplastic resin layer is higher than a shearing force of said thermoplastic resin layer and said color developer layer when said recording medium is heated to the predetermined temperature.

7. The recording medium according to claim 1, wherein an adhesion force between said thermoplastic resin layer and said color developer layer is higher than a shearing force of said thermoplastic layer and said color developer layer when said recording medium is heated to the predetermined temperature.

8. A method for forming an image on a material comprising:
   forming an image on a recording medium, said recording medium including a base sheet, a thermoplastic resin layer formed on said base sheet, and a color developer layer formed on said thermoplastic resin layer, by reacting a color developer of said color developer layer with a dye precursor;
   superposing said color developer layer of said recording medium on which the image has been formed, and a material on which the image is to be formed;
   bonding and heating said superposed recording medium and said material to bond said color developer layer of said recording medium and said material to each other; and separating said base sheet of said recording medium from said thermoplastic resin layer and said developer layer after bonding said superposed recording medium and said material.

9. The method according to claim 8, wherein said color developer layer includes a binder which is made molten by said heating.

10. The method according to claim 9, wherein said color developer layer is selected from the group consisting of inorganic acidic materials, phenolic compounds and aromatic carboxylic acid compounds.

11. The method according to claim 8, wherein said bonding step also includes pressing said superposed recording medium and material.

12. The method according to claim 11, wherein the step of forming the image on the recording medium includes:
pressing microcapsules against said recording medium whereby said microcapsules are selectively ruptured based on a latent image and a color image is formed on said developer layer of said recording medium by a reaction of a color developer of the color developer layer with a dye precursor released from the ruptured microcapsules.

13. The method according to claim 12, wherein said step of forming the image on the recording medium further includes:
exposing a photosensitive, pressure-sensitive medium having a layer of said microcapsules to a light having image information, whereby a hardness of exposed microcapsules is changed and said latent image corresponding to the image information is formed on the layer of microcapsules; and
superposing said color developer layer of said recording medium and said layer of microcapsules of said photosensitive, pressure-sensitive medium prior to said step of pressing microcapsules against said recording medium.

14. The method according to claim 12, wherein said superposed recording medium and material are pressed against each other while being heated with less force than said superposed recording medium and photosensitive, pressure-sensitive medium are pressed against each other.

15. The method according to claim 8, wherein said heating is performed by passing said superposed recording medium and material between a pair of heated rollers.

16. The method according to claim 8, wherein said heating of said superposed recording medium and material causes said thermoplastic resin layer to soften said separating step being performed while said recording medium and said material are heated.

17. A recording medium comprising:
a base sheet;
a thermoplastic resin layer formed on at least one side of said base sheet; and
a color developer layer formed on said thermoplastic resin layer and capable of color development by reaction with a dye precursor; wherein said thermoplastic resin layer softens when heated to a predetermined temperature, and an adhesion force between said thermoplastic resin layer and said color developer layer is higher than an adhesion force between said thermoplastic resin layer and said base sheet at said predetermined temperature so that said base sheet is separable from said thermoplastic resin layer at said predetermined temperature.

* * * * *